(12) United States Patent
Li et al.

(10) Patent No.: US 10,396,865 B2
(45) Date of Patent: Aug. 27, 2019

(54) SPECTRAL ANALYSIS SIGNAL IDENTIFICATION

(71) Applicant: CommScope Technologies LLC, Hickory, NC (US)

(72) Inventors: Zhao Li, Forest, VA (US); Kevin Walkup, Forest, VA (US)

(73) Assignee: CommScope Technologies LLC, Hickory, NC (US)

( * ) Notice: Subject to any disclaimer, the term of this patent is extended or adjusted under 35 U.S.C. 154(b) by 32 days.

(21) Appl. No.: 15/559,340

(22) PCT Filed: Jul. 14, 2015

(86) PCT No.: PCT/US2015/040334
§ 371 (c)(1),
(2) Date: Sep. 18, 2017

(87) PCT Pub. No.: WO2016/148734
PCT Pub. Date: Sep. 22, 2016

(65) Prior Publication Data
US 2018/0115348 A1 Apr. 26, 2018

Related U.S. Application Data

(60) Provisional application No. 62/135,296, filed on Mar. 19, 2015.

(51) Int. Cl.
*H04B 7/0413* (2017.01)
*C01B 25/45* (2006.01)
(Continued)

(52) U.S. Cl.
CPC .......... *H04B 7/0413* (2013.01); *C01B 25/45* (2013.01); *G01R 23/173* (2013.01); *H01M 4/131* (2013.01);
(Continued)

(58) Field of Classification Search
None
See application file for complete search history.

(56) References Cited

U.S. PATENT DOCUMENTS 3,984,669 A * 10/1976 Lehmann ............... G01R 23/00
708/405
4,209,672 A * 6/1980 Nitta .................... H04R 29/001
367/13
(Continued)

OTHER PUBLICATIONS

International Searching Authority, "International Search Report from PCT Application No. PCT/US2015/040334 dated Dec. 21, 2015", Dec. 21, 2015, pp. 1-3, Published in: WO.
(Continued)

*Primary Examiner* — Kenneth N Vanderpuye
*Assistant Examiner* — David W Lambert
(74) *Attorney, Agent, or Firm* — Fogg & Powers LLC

(57) ABSTRACT

A telecommunications system may include a measurement receiver to confirm the presence of a MIMO signal prior to decoding signals to avoid decoding spectrum that does not include MIMO signals. The measurement receiver may determine a fast Fourier transform (FFT) spectrum for asynchronous wideband digital signals received from two or more ports. The measurement receiver may determine an average FFT spectrum based on the determined FFT spectrum and identify a bandwidth of signals present in the average FFT spectrum. The measurement receiver may identify the MIMO signals present in the bandwidth of signals and decode only the identified MIMO signals.

18 Claims, 6 Drawing Sheets

(51) Int. Cl.
*H01M 4/131* (2010.01)
*G01R 23/173* (2006.01)
*H04J 14/02* (2006.01)
*H01M 4/62* (2006.01)
*H01M 4/64* (2006.01)
*H01M 4/134* (2010.01)
*H01M 4/38* (2006.01)
*H01M 4/36* (2006.01)
*H01M 4/58* (2010.01)
*H01M 10/052* (2010.01)
*H01M 4/02* (2006.01)
*H04L 1/00* (2006.01)
*H04L 27/26* (2006.01)
*H01M 4/136* (2010.01)

(52) U.S. Cl.
CPC .......... *H01M 4/134* (2013.01); *H01M 4/362* (2013.01); *H01M 4/386* (2013.01); *H01M 4/621* (2013.01); *H01M 4/64* (2013.01); *H04J 14/0247* (2013.01); *H04J 14/0282* (2013.01); *H01M 4/136* (2013.01); *H01M 4/387* (2013.01); *H01M 4/5825* (2013.01); *H01M 10/052* (2013.01); *H01M 2004/027* (2013.01); *H01M 2004/028* (2013.01); *H04J 2014/0253* (2013.01); *H04L 1/0045* (2013.01); *H04L 27/2675* (2013.01)

(56) References Cited

U.S. PATENT DOCUMENTS

| | | | | |
|---|---|---|---|---|
| 5,119,017 | A | * | 6/1992 | Labarre .................. G01R 27/28 324/76.19 |
| 6,477,181 | B1 | * | 11/2002 | Fujimori ............... H04J 3/0632 370/476 |
| 8,111,608 | B2 | | 2/2012 | Takahashi et al. |
| 2006/0274859 | A1 | * | 12/2006 | Zinser ................. H03M 1/1038 375/340 |
| 2008/0069252 | A1 | | 3/2008 | Wenzhen et al. |
| 2008/0192855 | A1 | * | 8/2008 | Shapira .................. G01S 3/023 375/267 |
| 2009/0154585 | A1 | | 6/2009 | Lee et al. |
| 2009/0302829 | A1 | | 12/2009 | Kanoh et al. |
| 2013/0177317 | A1 | | 7/2013 | Rospsha et al. |
| 2015/0016441 | A1 | * | 1/2015 | Hanson ................. H04W 16/02 370/338 |

OTHER PUBLICATIONS

International Searching Authority, "Written Opinion from PCT Application No. PCT/US2015/040334 dated Dec. 21, 2015", Dec. 21, 2015, pp. 1-3, Published in: WO.

European Patent Office, "Extended Search Report from EP Application No. 15885750.8 dated Oct. 8, 2018" From Foreign Counterpart of U.S. Appl. No. 15/559,340; pp. 1-10; Published in EP.

* cited by examiner

SPECTRAL ANALYSIS SIGNAL IDENTIFICATION

CROSS-REFERENCE TO RELATED APPLICATION

This application is a U.S. National Stage application of PCT Application Ser. No. PCT/US2015/040334, filed 14 Jul. 2015 and titled "Spectral Analysis in Identifying Signals in a Telecommunication System," which claims the benefit of U.S. Provisional Application Ser. No. 62/135,298, filed Mar. 19, 2015and titled "Spectral Analysis in Identifying Signals in a Telecommunication System," the contents of all of which are incorporated herein by reference

TECHNICAL FIELD

The present disclosure relates generally to telecommunications and more specifically to the use of spectral analysis in identifying signals in a telecommunications system.

BACKGROUND

In telecommunications systems, such as digital distributed antenna systems or digital repeaters, base station signals of various modulation types within different frequency bands may need to be identified. When a telecommunications system is commissioned or otherwise installed, a system-wide scanning process may be implemented to identify the signal types and bands. The scanning process may be implemented per telecommunications port and band-by-band. Among other things, the scanning process may discover each signal's modulation type, downlink or uplink center frequency, bandwidth, cell ID, mobile country code or mobile network code, and antenna port information (e.g., if it is of a multiple-input-multiple-output (MIMO) configuration).

SUMMARY

According to one aspect of the present disclosure, a method is provided for decoding MIMO signals. The method may involve a measurement receiver receiving asynchronous wideband digital signals from two or more ports of a telecommunications system that is communicatively coupled to at least one base station. The method may also involve determining a wideband fast Fourier transform (FFT) spectrum for each of the asynchronous wideband digital signals. The method may also involve determining an average FFT spectrum for each of the two or more ports based on the wideband FFT spectrum for each of the two or more ports. The method may also involve identifying a bandwidth of signals present in the average FFT spectrum for each of the two or more ports. The method may also involve MIMO signals present in the bandwidth of signals. The method may also involve decoding the MIMO signals.

According to another aspect, a measurement receiver is provided. The measurement receiver may include a receiver. The receiver may include circuitry configured for capturing asynchronous wideband digital signals from two or more ports of a telecommunications system. The asynchronous wideband digital signals may be captured at varying time intervals. The measurement receiver may also include a processor. The processor may be configured for executing a set of instructions stored in a memory. The set of instructions may cause the measurement receiver to determine a wideband fast Fourier transform (FFT) spectrum for each of the asynchronous wideband digital signals. The set of instructions may also cause the measurement receiver to determine an average FFT spectrum for each of the two or more ports. The set of instructions may also cause the measurement receiver to identify a bandwidth of signals present in the average FFT spectrum for each of the two or more ports. The set of instructions may also cause the measurement receiver to identify MIMO signals present in the bandwidth of signals. The set of instructions may also cause the measurement receiver to decode the MIMO signals.

According to another aspect, a telecommunications system is provided. The telecommunications system may include a head-end unit configured to be coupled to one or more remote units. The head-end unit may include two or more ports for coupling to at least one base station. The two or more ports may be configured to receive asynchronous wideband digital signals from the at least one base station. The head-end unit may also include a measurement receiver. The measurement receiver may be configured to determine a wideband fast Fourier transform (FFT) spectrum for each of the asynchronous wideband digital signals. The measurement receiver may also be configured to determine an average FFT spectrum for each of the two or more ports. The measurement receiver may also be configured to identify a bandwidth of signals present in the average FFT spectrum for each of the two or more ports. The measurement receiver may also be configured to identify MIMO signals present in the bandwidth of signals. The measurement receiver may also be configured to decode the MIMO signals.

These illustrative aspects and features are mentioned not to limit or define the disclosure, but to provide examples to aid understanding of the concepts disclosed herein. Other aspects, advantages, and features of the present disclosure will become apparent after review of the entire application.

DETAILED DESCRIPTION

Certain aspects and features relate to performing spectral analysis in a telecommunications system to confirm the presence of a MIMO signal prior to decoding signals to avoid decoding spectrum that does not include MIMO signals. Multiple copies of spectra from ports of the telecommunications system may be checked to confirm a MIMO 4×4 (four input, four output) or MIMO 2×2 (two input, two output) configuration prior to decoding attempts to save scan time spent on these new modulation types. Non-MIMO signals or other signals of another modulation type (e.g., LTE single-input-single-output (SISO)) may be decoded only if there are no signs of MIMO signals in the spectra.

Figure 1:
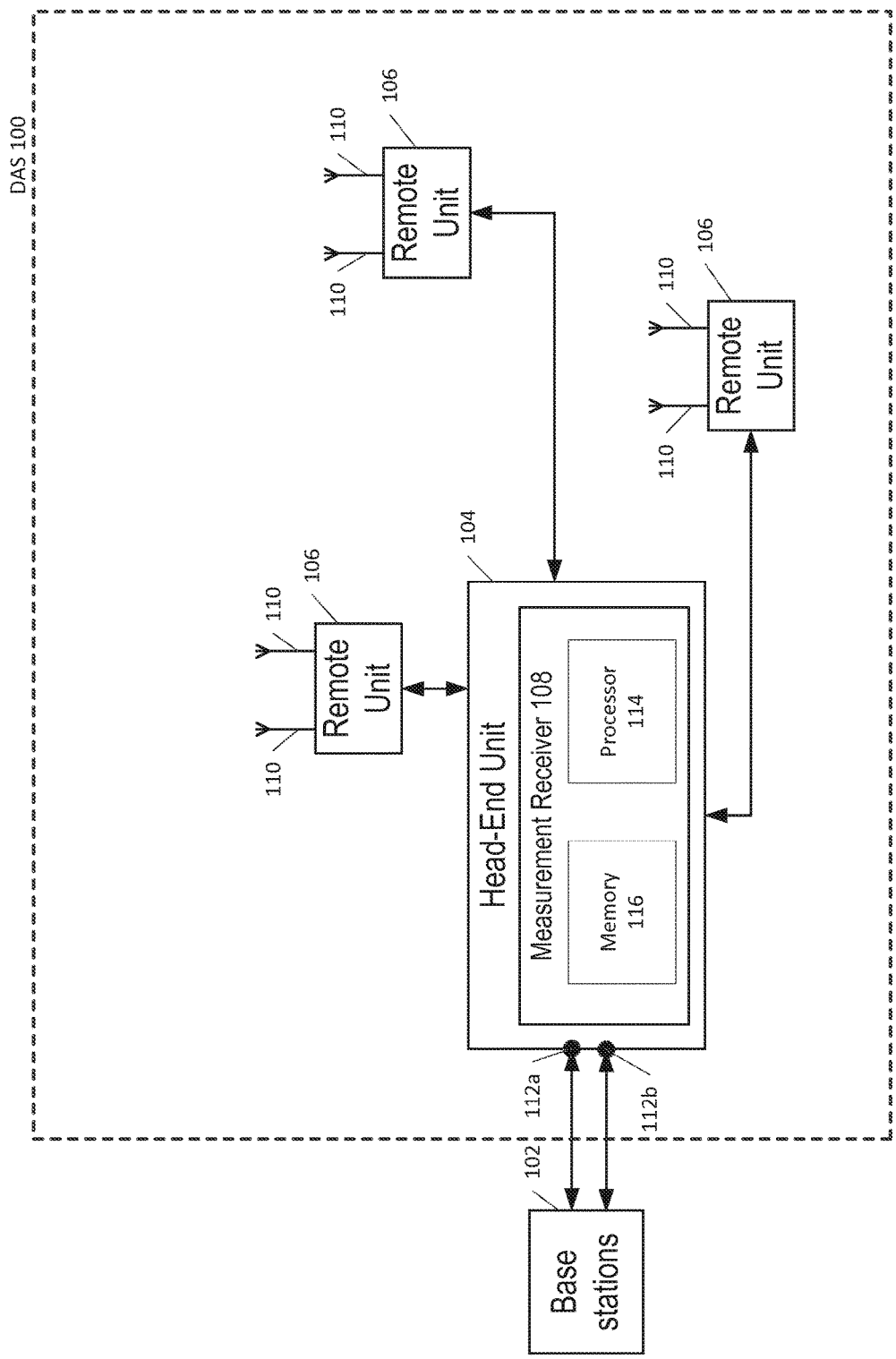
FIG. 1 is a block diagram of a telecommunications system with a measurement receiver according to one example.

Decoding a signal may involve locating the center frequency and estimating the bandwidth. The center frequency and bandwidth may be confirmed by locating a pilot signal associated with the signal and decoding a downlink broadcast channel (BCH) of the carrier. But, the time to locate the pilot signal and decode the BCH of the carrier may be a fixed time for each modulation type. Decoding only MIMO signals, when present, may decrease this overall time and may enhance the user experience of the system. A telecommunications system may include a distributed antenna system ("DAS") or a repeater. For example, FIG. 1 illustrates an example of a telecommunications system that is a DAS 100 communicatively coupled to one or more base stations 102. The DAS 100 may communicate signals between the base stations 102 and terminal devices (not shown) in one or more coverage zones serviced by the DAS 100. The terminal devices may be electronic devices used to communicate voice or data wirelessly within the DAS 100. The DAS 100 may communicate signals to terminal devices via a head-end unit 104 and remote units 106 that service the coverage zones. The head-end unit 104 may be communicatively coupled with the remote units 106 in any suitable manner. Communicatively coupling devices in a DAS 100 or other telecommunications system may involve establishing, maintaining, or otherwise using a communication link (e.g., a cable, an optical fiber, a wireless link, etc.) to communicate information between the devices.

The head-end unit 104 may receive downlink signals from the base stations 102 or transmit uplink signals to the base stations 102. Any suitable communication link may be used for communication between the base stations 102 and the head-end unit 104. Examples of suitable communication links may include copper cable, an optical fiber, another suitable communication medium, a wireless RF communication link, or a microwave link. The head-end unit 104 may include a measurement receiver 108 for detecting the presence of signals of a particular type and band received from the base stations 102. In some examples, the measurement receiver 108 may be implemented in a field-programmable gate array ("FPGA").

The remote units 106 may provide signal coverage in the coverage zones. The remote units 106 may include transceiving devices that may include or be communicatively coupled to one or more antennas 110. Providing signal coverage in the coverage zones can include wirelessly transmitting downlink signals received from the head-end unit 104 to terminal devices in the coverage zones. Providing signal coverage in the coverage zones may also include wirelessly receiving uplink signals from the mobile communication devices or other terminal devices in the coverage zones. The remote units 106 may transmit the uplink signals to the head-end unit 104.

The measurement receiver 108 may be communicatively coupled to two or more ports 112a, 112b through circuitry that may include digitization circuitry for digitizing signals received from base stations. The ports 112a, 112b may be communicatively coupled to the base stations 102. The measurement receiver 108 may include a processor 114 for executing the spectral analysis of the signals. The processor 114 may include any processing device or group of processing devices for executing program code or other instructions stored in a memory 116. Examples of the processor 114 may include a microprocessor, an application-specific integrated circuit ("ASIC"), a field-programmable gate array ("FPGA"), or other suitable processor. The memory 116 can include, for example, a non-transitory computer-readable medium.

Figure 2:
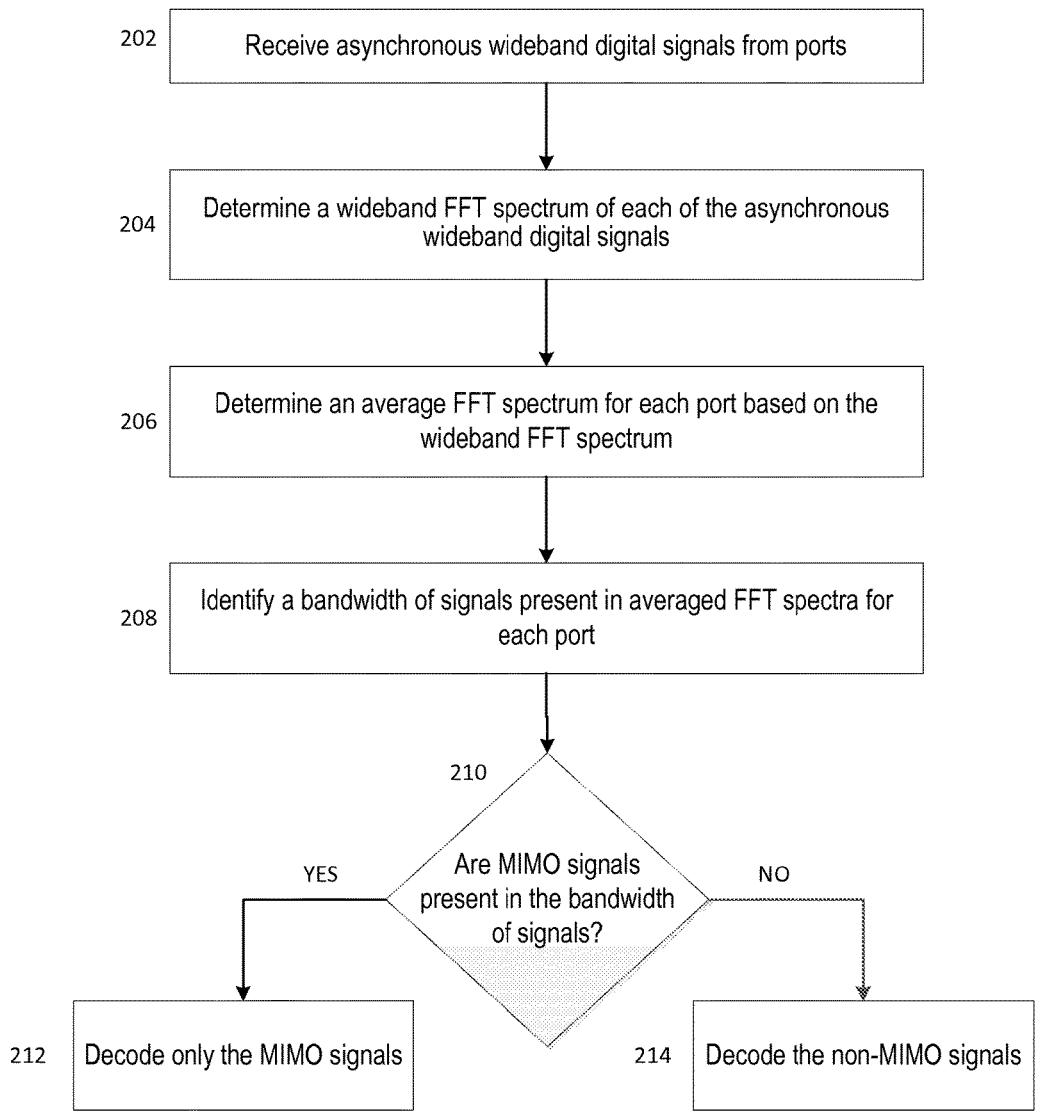
FIG. 2 is a flowchart depicting a process for identifying signals in a telecommunications system according to one example.

FIG. 2 is a flow chart depicting an example of a process for detecting types and bands of signals received by a DAS from a base station. The process of FIG. 2 is described with reference to the system in FIG. 1, although other implementations of the process are possible without departing from the scope of the present disclosure.

In block 202, the measurement receiver 108 receives asynchronous wideband digital signals (e.g., up to 100 MHz baseband) from ports of the head-end unit 104. The asynchronous wideband digital signals may be received from ports 112a, 112b, as supported by the head-end unit 104 hardware. The wideband digital signals may be received from the ports 112a, 112b at different points in time or on an interval basis —e.g., interleaved. The interval of capture and the number of captures from each port 112a, 112b may be pre-set by software or other controls in the memory 116 of the measurement receiver 108.

A fast Fourier transformation (FFT) process may be performed on the captured digital signals. As an example, for a 100 MSPS sample rate with 32768 samples in the time domain, the frequency domain resolution may be approximately 6 KHz per FFT bin. This resolution may allow the measurement receiver 108 to identify spectra for various modulation types detected by the system.

In this example, $A_i^{(p)} = \{a_i^{(p)}(0), a_i^{(p)}(1), \ldots, a_i^{(p)}(N-1)\}$ may be the $i^{th}$ time domain capture from port 112a, represented in the equation by p, where $a_i^{(p)}(0)$ is a complex sample from port p at time index 0 within the $i^{th}$ capture and where =0, 1, 2, . . . , 7, p=1, 2, 3, 4 (for a MIMO 4×4) and N=32768. The processor 114 of the measurement receiver 108 may be executed to perform the following captures, one after the other, into the memory 116. Even though time indexes 0, 1, 2, . . . , N−1 may be used repeatedly in representing captures, in some aspects, these samples may not be time-aligned, but instead occur sequentially in time:
$A_0^{(1)}, A_0^{(2)}, A_0^{(3)}, A_0^{(4)}; A_1^{(1)}, A_1^{(2)}, A_1^{(3)}, A_1^{(4)}, \ldots, A_7^{(1)}, A_7^{(2)}, A_7^{(3)}, A_7^{(4)}$
where, A represents a capture, where the subscript represents a capture index and the superscript represents port number.

Each capture may take less than a subframe (e.g., 1 ms), so the eight captures on port p may be spread out across multiple frames. Transient traffic activities in one subframe may not drastically affect the overall spectrum. The time between captures of $A_i^{(p)}$ may be adjusted by software in the memory of the measurement receiver to capture spectra over time. In some aspects, the total number of captures per port 112a, 112b, (e.g., eight) may be adjustable.

In block 204, the measurement receiver determines a wideband FFT spectrum for each of the received signals. This may represent a power spectrum of the signals received in each port 112a, 112b. In some aspects, the wideband FFT spectrum may be determined using a windowing technique. Windowing may be a signal processing technique used to smooth data, such as by removing effects introduced in truncating data by the FFT process. Various types of windowing functions may be used for calculating a wideband FFT spectrum (e.g., a Blackman-Harris window function, a Hamming, Hanning, Bartlett and Blackman window function).

For example, a symmetric four-term Blackman-Harris window may include a length N=32768 that may be used to suppress side lobes through truncation. The Blackman- Harris window may provide over 90 dB side-lobe suppression to generate a clean spectrum. The Blackman-Harris window function may be represented as:

$$w(n) = k_0 - k_1\cos\left(\frac{2\pi n}{N-1}\right) + k_2\cos\left(\frac{4\pi n}{N-1}\right) - k_3\cos\left(\frac{6\pi n}{N-1}\right) 0 \le n \le N-1,$$

where $k_0$, =0.35875, $k_1$=0.48829, $k_2$=0.14128, $k_3$=0.01168, and n=a software—selected sample index. $B_i^{(p)} = \{b_i^{(p)}(0), b_i^{(p)}(1), \ldots, b_i^{(p)}(N-1)\}$ may be the $i^{th}$ windowed time sequence of the capture from port (p), where $b_i^{(p)}(j)=w(j)a_i^{(p)}(j)$, $0 \le j \le N-1$.

An FFT process may be performed on each of the windowed time sequences (4×8 in the case of MIMO 4×4 and 2×8 in the case of MIMO 2×2) to produce 32768 points of symmetric frequency domain representation. Of the 32768 points, only 16384 positive frequency points may be used in the spectral analyses. For example, $C_i^{(p)} = \{c_i^{(p)}(0), c_i^{(p)}(1), \ldots, c_i^{(p)}(M-1)\}$ may be the $i^{th}$ positive spectrum power from port (p), calculated by taking a length N FFT and the norm squared of each positive frequency term (0 to M−1) in the FFT result. The power spectrum may be denoted as:

$$C_i^{(p)} = \|FFT(B_i^{(p)})_0^{M-1}\|^2$$

In block 206, the measurement receiver may determine an average FFT spectrum for the wideband FFT spectrum of each port. In some examples, the average FFT spectrum may be calculated over time and filtered for each port based on the frequency of the signals. The output may be an average FFT spectrum per port. The average FFT spectra may be converted to dB using a 10 log 10 function. A moving average function (e.g., a sliding window) may be applied to smooth the function at each port.

For example, the time averaging of eight spectra from ports 112a, 112b may be represented as: $D^{(p)} = \{d^{(p)}(0), d^{(p)}(1), \ldots, d^{(p)}(M-1)\}$, where M=16384 and $d^{(p)}(j) = \frac{1}{8}\sum_{i=0}^{i=7} c_i^{(p)}(j)$, $0 \le j \le M-1$. This may complete the linear time averaging of the eight spectra received at each port 112a, 112b. The average FFT spectrum of the ports 112a, 112b may be converted, respectively, into dB with the 10 log 10 function. The average FFT spectrum in dB may be represented as $E^{(p)} = \{e^{(p)}(0), e^{(p)}(1), \ldots, e^{(p)}(M-1)\}$, where $e^{(p)}(j) = 10\log_{10}(d^{(p)}(j))$, $0 \le j \le M-1$. The sliding window (of length L) type of moving average may be performed on the average FFT spectrum of each port to generate smoothed power spectrum, which may be represented as $F^{(p)} = \{f^{(p)}(0), f^{(p)}(1), \ldots, f^{(p)}(M-1)\}$, where $$f^{(p)}(j) = \frac{1}{L}\sum_{\substack{l=j-L/2 \\ l \ge 0}}^{\substack{l=j+L/2 \\ l \le M-1}} e^{(p)}(l).$$

The length L of the sliding window may be a programmed value stored in the memory 116. The value of the length may be small enough to avoid destroying the spectral features of the spectrum, but large enough to smooth out sharp spikes (e.g., length 11 or 12). In some aspects, the value for the length may be determined by experiment.

In block 208, the measurement receiver 108 identifies the bandwidth of signals present in averaged FFT spectra. To identify the bandwidth of signals, a "smart" search may be conducted to locate local maximums of power level in the spectrum for each port 112a, 112b. For each local maximum of power level, a search may be performed in a forward direction to determine a "back" of the spectra (e.g., after a drop below a certain threshold, by x-dB). A second search may be performed in the opposite direction to identify a "front" of the spectra (e.g., after a drop, by x-dB). Signals within the appropriate range (x) may be retained for further processing. Signals outside of the range may not be processed. The value x defining the range may be modulation dependent and programmable in the software stored in the memory 116.

For example, an algorithm stored in the memory of the measurement receiver 108 may be implemented by the processor 114 using a known noise floor, radio frequency calibration parameters, and a modulation type for the signal searched. The measurement receiver 108 may search the smoothed power spectrum to find local peaks and their associated power drop points (e.g., a drop by x-dB) around those local peaks. In some examples for packed spectrum of Global System for Mobile Communications ("GSM") or Code Division Multiple Access (e.g., CDMA2K), the value may be set to 8 dB (e.g., x=8) and for LTE this value can be 20 dB (e.g., x=20) according to one example.

In block 210 of FIG. 2, the measurement receiver 108 determines whether MIMO signals are present in the bandwidth of signals. This determination may be made based on a power level comparison to determine any overlap with other signals. By identifying similarities among multiple spectra, certain spectra may be identified as not being MIMO. For example, if a spectra does not overlap any other spectra by more than a predetermined threshold (e.g., by 85%) in frequency, then the spectra may be identified as non-MIMO. Similarly, if the integrated signal power of a spectra, as compared to another differs by more than a selected threshold (e.g., by 10 dB), the spectra is identified as non-MIMO. Conversely, if the overlap percentage is over the predetermined threshold and the integrated signal power is within the selected threshold, MIMO signals may be present and the MIMO configuration on the ports 112a, 112b may be confirmed.

In block 212, the measurement receiver 108 decodes only the MIMO signals identified in the bandwidth of signals. The measurement receiver 108 may decode the MIMO signals by locating the center frequency and estimating the bandwidth of the signals. The center frequency and bandwidth may be confirmed by locating a pilot signal associated with each signal and decoding a downlink broadcast channel (BCH) of the carrier. In block 214, the measurement receiver 108 decodes the non-MIMO signals in the bandwidth of signals where no MIMO signals were identified.

Figure 3:
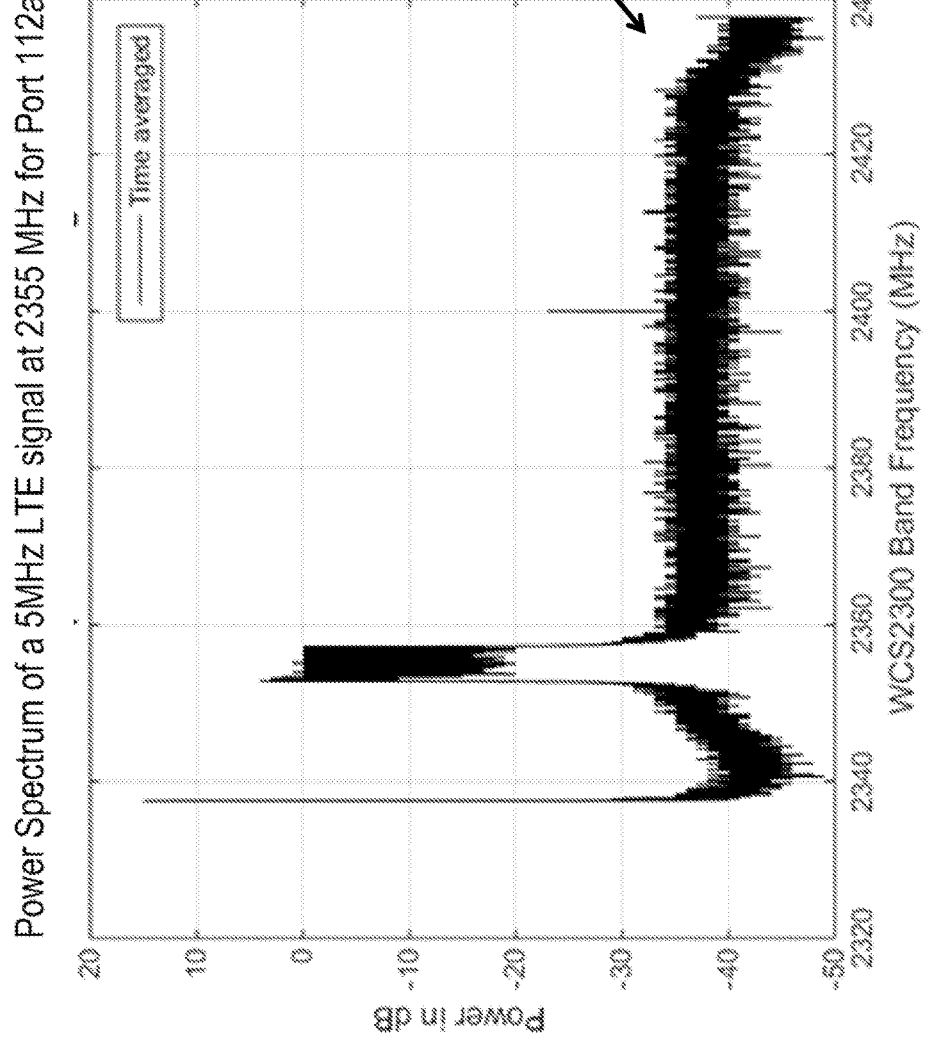
FIG. 3 depicts a power spectrum of results of processing signals from a first port of a telecommunications system according to one example.
Figure 4:
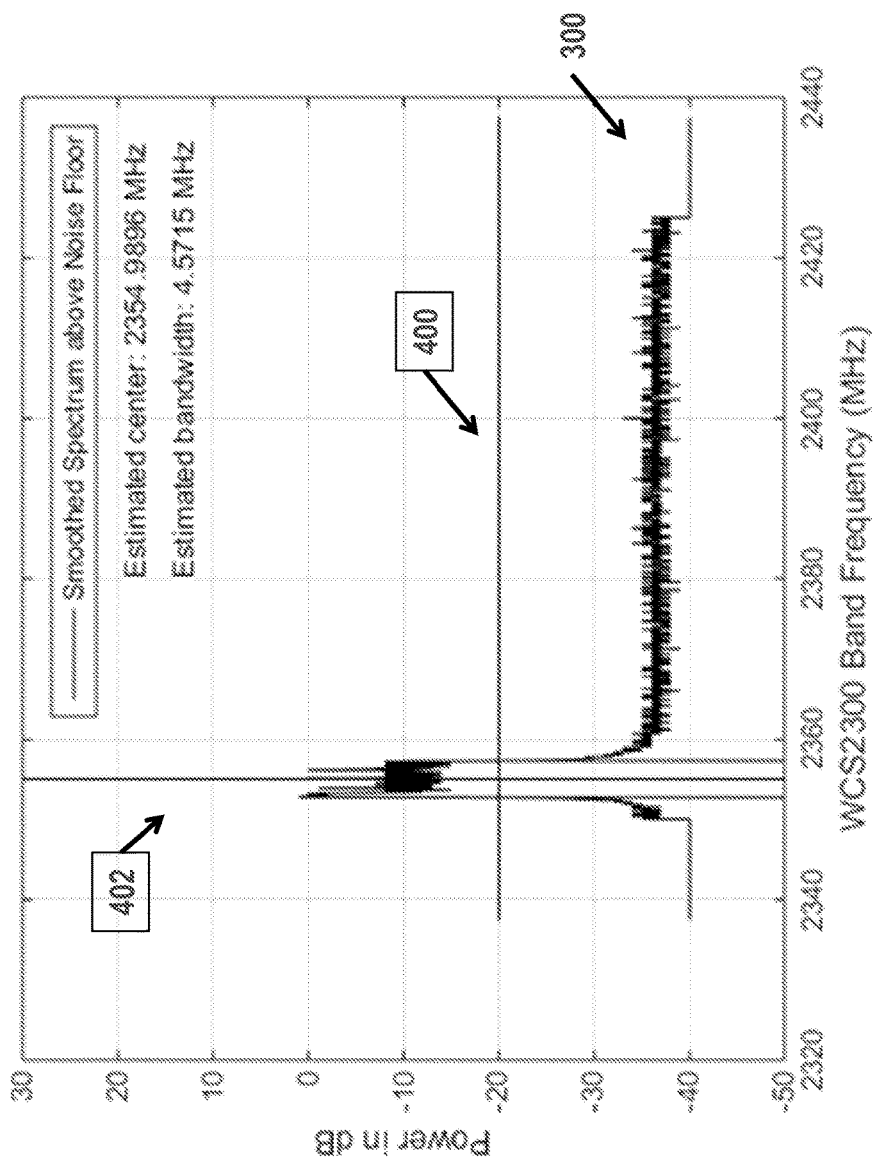
FIG. 4 depicts a power spectrum of results of processing signals from the first port of a telecommunications system after a bandwidth of signals has been identified according to one example.
Figure 5:
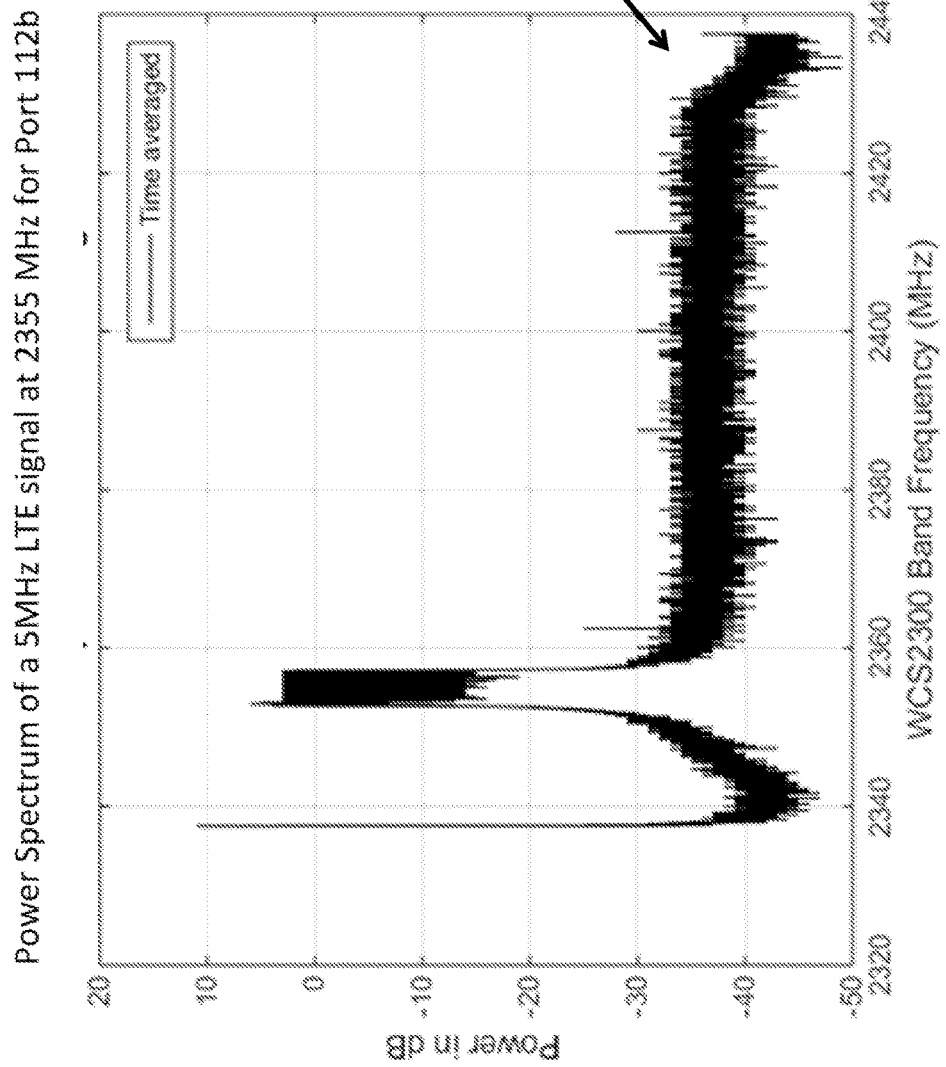
FIG. 5 depicts a power spectrum of results of processing signals from a second port of a telecommunications system according to one example.
Figure 6:
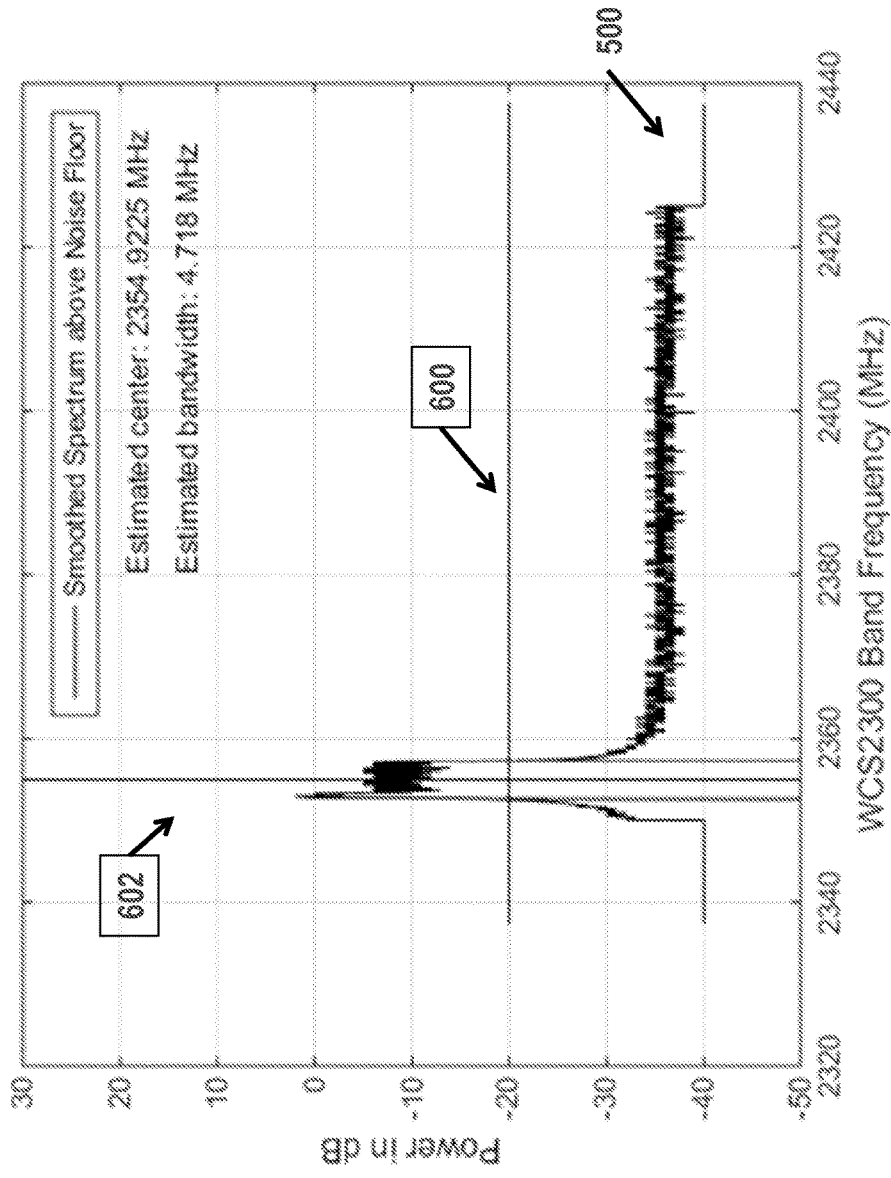
FIG. 6 depicts a power spectrum of results of processing signals from the second port of a telecommunications system after a bandwidth of signals has been identified according to one example.

FIGS. 3-6 illustrate examples of processing results of the captured wideband data from an LTE MIMO 2×2 base station 102 subsequent to identifying the bandwidth of signals present in averaged FFT spectra. FIGS. 3 and 4 depict a display of the results from signals associated with the first port 112a of the head-end unit 104. FIGS. 5 and 6 depict a display of results from signals associated with the second port 112b of the head-end unit 104. The spectra displayed in each of FIGS. 3-6 represent a power spectrum 300, 500 of a 5 MHz LTE signal at 2355 MHz for each of the first and second ports 112a, 112b, respectively. The horizontal, or x, axis of the display represents the WCS2300 band frequency in MHz. The vertical, or y, axis of the display represents the power of the LTE signal in dB. FIGS. 3 and 5 depict the results of the power spectrum 300 of the first port 112a and the power spectrum 500 of the second port 112b, respectively, after the signals have been averaged over time. Time averaging may reduce the spectral fluctuations from a single spectrum. In some aspects, the power spectra 300, 500 may further be smoothed (e.g., FIGS. 4 and 6). The smoothed power spectra may be displayed overlapping with or alternatively to the display of the time averaged power spectra 300, 500.

FIGS. 4 and 6 depict results of the power spectra 300, 500 of the first port 112a and the second port 112b, respectively, after bandwidths of the signals have been identified. The power spectra 300, 500 may be smoothed using windowing (e.g., a moving average function). The center frequencies may be estimated by determining where each power spectrum 300, 500 intersects with lines 400, 600, respectively, positioned at −20 dB for LTE signals. The distance of each line 400, 600 along the horizontal axis between the intersection points may represent the estimated center frequencies. The estimated center frequencies may very close to the target and correct if a function of rounding to the nearest 100 KHz is applied to force it on to LTE channel raster.

The channel bandwidth of each port 112a, 112b may be estimated by the local maximum of the power spectra 300, 500. This may be an intersection of lines 402, 602 with the power spectra 300, 500, respectively when lines 402, 602 are positioned halfway between or central to the intersection points of lines 400, 600 with power spectra 300, 500, respectively. The estimated channel bandwidth 402, 602, respectively, may also be accurate since a 5 MHz LTE is 4.5 MHz wide with 300 resource elements at 15 KHz each.

The foregoing description of the examples, including illustrated examples, has been presented only for the purpose of illustration and description and is not intended to be exhaustive or to limit the subject matter to the precise forms disclosed. Numerous modifications, adaptations, and uses thereof will be apparent to those skilled in the art without departing from the scope of this disclosure. The illustrative examples described above are given to introduce the reader to the general subject matter discussed here and are not intended to limit the scope of the disclosed concepts.

What is claimed is:

1. A method, comprising:
receiving asynchronous digital signals from two or more ports of a telecommunications system communicatively coupled to at least one base station;
determining, for each of the asynchronous digital signals, a fast Fourier transform (FFT) spectrum;
determining an average FFT spectrum for each of the two or more ports based on the FFT spectrum for each of the two or more ports;
identifying a bandwidth of signals present in the average FFT spectrum for each of the two or more ports;
identifying MIMO signals present in the bandwidth of signals by:
comparing the bandwidth of signals corresponding to a first port of the two or more ports and the bandwidth of signals corresponding to each of one or more remaining ports of the two or more ports; and
filtering out signals in the bandwidth of signals corresponding to the first port that do not overlap with any of the bandwidth of signals corresponding to any of the one or more remaining ports by more than a predetermined threshold; and
decoding the MIMO signals.

2. The method of claim 1, wherein decoding the MIMO signals includes decoding, by a measurement receiver, only the MIMO signals present in the bandwidth of signals and not decoding non-MIMO signals present in the bandwidth of signals.

3. The method of claim 1, wherein capturing the asynchronous digital signals includes receiving, by a measurement receiver, digital signals from the two or more ports at varying time intervals and storing signal information representative of the digital signals in a memory of the measurement receiver.

4. The method of claim 1, wherein the average FFT spectrum is determined by applying one or more windows to the asynchronous digital signals.

5. The method of claim 4, wherein applying the one or more windows to the asynchronous digital signals includes applying a symmetric four-term Blackman-Harris window to truncate the asynchronous digital signals by minimizing side-lobe levels of the asynchronous digital signals.

6. The method of claim 1, wherein determining the average FFT spectrum includes producing frequency points representative of a frequency domain of the asynchronous digital signals.

7. The method of claim 1, wherein the average FFT spectrum for each of the two or more ports is a moving average FFT spectrum, wherein determining the moving average FFT spectrum includes:
averaging an FFT spectrum for each of the two or more ports over a capture time;
filtering a frequency from the FFT spectrum for each of the two or more ports; and
applying a sliding window to produce the moving average FFT spectrum.

8. The method of claim 1, wherein identifying the bandwidth of signals includes identifying a local maximum power level for the average FFT spectrum for each of the two or more ports by:
executing a forward search of the average FFT spectrum for each of the two or more ports for a first power level drop by a threshold associated with a modulation type of the asynchronous digital signals, wherein the forward search identifies a back frequency that is associated with the first power level drop and greater than a frequency associated with the local maximum power level;
executing a backward search of the average FFT spectrum for each of the two or more ports for a second power level drop by the threshold, wherein the backward search identifies a front frequency that is associated with the second power level drop and less than the frequency associated with the local maximum power level; and
determining a signal bandwidth between the first power level drop and the second power level drop on a frequency axis of the average FFT spectrum.

9. A measurement receiver, comprising:
a receiver having circuitry configured for capturing asynchronous digital signals from two or more ports of a telecommunications system at varying time intervals; and
a processor configured for executing a set of instructions stored in a memory for causing the measurement receiver to:
determine, for each of the asynchronous digital signals, a fast Fourier transform (FFT) spectrum;
determine an average FFT spectrum for each of the two or more ports;
identify a bandwidth of signals present in the average FFT spectrum for each of the two or more ports;

identify MIMO signals present in the bandwidth of signals by:
comparing the bandwidth of signals corresponding to a first port of the two or more ports and the bandwidth of signals corresponding to each of one or more remaining ports of the two or more ports; and
filtering out signals in the bandwidth of signals corresponding to the first port that do not overlap with any of the bandwidth of signals corresponding to any of the one or more remaining ports by more than a predetermined threshold; and
decode the MIMO signals.

10. The measurement receiver of claim 9, wherein the processor is configured to cause the measurement receiver to produce frequency points representative of a frequency domain of the asynchronous digital signals.

11. The measurement receiver of claim 9, further comprising:
an interface coupled to a display for graphically displaying the average FFT spectrum for each of the two or more ports based on frequency points representative of a frequency domain of the asynchronous digital signals.

12. The measurement receiver of claim 9, wherein the processor is configured to cause the measurement receiver to identify the bandwidth of signals present in the average FFT spectrum for each of the two or more ports by identifying one or more local power level maximums in the average FFT spectrum for each of the two or more ports.

13. The measurement receiver of claim 12, wherein the processor is configured to cause the measurement receiver to identify at least one of the one or more local power level maximums by:
executing a forward search of the average FFT spectrum for each of the two or more ports for a first power level drop by a threshold determined by the set of instructions, wherein the forward search identifies a back frequency that is associated with the first power level drop and greater than a frequency associated with the local maximum power level;
executing a backward search of the average FFT spectrum for each of the two or more ports for a second power level drop by the threshold determined by the set of instructions, wherein the backward search identifies a front frequency that is associated with the second power level drop and less than the frequency associated with the local maximum power level; and
determining a signal bandwidth between the first power level drop and the second power level drop on a frequency axis of the average FFT spectrum.

14. A telecommunications system, comprising:
a head-end unit configured to be coupled to one or more remote units, the head-end unit comprising:
two or more ports for coupling to at least one base station, the two or more ports being configured to receive asynchronous digital signals from the at least one base station;
a measurement receiver configured to:
determine, for each of the asynchronous digital signals, a fast Fourier transform (FFT) spectrum;
determine an average FFT spectrum for each of the two or more ports;
identify a bandwidth of signals present in the average FFT spectrum for each of the two or more ports;
identify MIMO signals present in the bandwidth of signals by:
comparing the bandwidth of signals corresponding to a first port of the two or more ports and the bandwidth of signals corresponding to each of one or more remaining ports of the two or more ports; and
filtering out signals in the bandwidth of signals corresponding to the first port that do not overlap with any of the bandwidth of signals corresponding to any of the one or more remaining ports by more than a predetermined threshold; and
decode the MIMO signals.

15. The telecommunications system of claim 14, wherein the measurement receiver is further configured to produce frequency points representative of a frequency domain of the asynchronous digital signals.

16. The telecommunications system of claim 14, wherein the measurement receiver is further configured to:
identify non-MIMO signals present in the bandwidth of signals; and
decode the non-MIMO signals based on an absence of the MIMO signals in the bandwidth of signals.

17. The telecommunications system of claim 16, wherein the measurement receiver is configured to identify the non-MIMO signals present in the bandwidth of signals by:
comparing the bandwidth of signals corresponding to the first port of the two or more ports and the bandwidth of signals corresponding to each of the one or more remaining ports of the two or more ports; and
selecting signals in the bandwidth of signals corresponding to the first port that do not overlap with any of the bandwidth of signals corresponding to any of the one or more remaining ports by more than the predetermined threshold.

18. The telecommunications system of claim 14, further comprising:
a display coupled to the measurement receiver for graphically displaying the average FFT spectrum for each of the two or more ports based on frequency points representative of a frequency domain of the asynchronous digital signals.

* * * * *